United States Patent
Seväkivi et al.

(10) Patent No.: US 11,406,040 B2
(45) Date of Patent: Aug. 2, 2022

(54) HEAT EXCHANGER AND COOLED ELECTRICAL ASSEMBLY COMPRISING THE SAME

(71) Applicant: ABB Schweiz AG, Baden (CH)

(72) Inventors: Pertti Seväkivi, Helsinki (FI); Niko Björkman, Helsinki (FI)

(73) Assignee: ABB Schweiz AG, Baden (CH)

( * ) Notice: Subject to any disclaimer, the term of this patent is extended or adjusted under 35 U.S.C. 154(b) by 49 days.

(21) Appl. No.: 17/113,408

(22) Filed: Dec. 7, 2020

(65) Prior Publication Data

US 2021/0176892 A1     Jun. 10, 2021

(30) Foreign Application Priority Data

Dec. 5, 2019 (EP) .................................. 19213829

(51) Int. Cl.
*H05K 7/20* (2006.01)
*F28F 13/12* (2006.01)

(52) U.S. Cl.
CPC ......... *H05K 7/20263* (2013.01); *F28F 13/12* (2013.01); *H05K 7/20272* (2013.01)

(58) Field of Classification Search
CPC . H01L 23/3672; H01L 23/467; H01L 23/473; F28F 13/12; F28F 2215/04; F28F 2250/00; F28F 2250/02; F28F 2265/30; F28F 2265/28; F28F 3/02; F28F 1/32; F28F 1/24; F28F 1/105; F28D 2021/0029
See application file for complete search history.

(56) References Cited

U.S. PATENT DOCUMENTS

| | | | | |
|---|---|---|---|---|
| 5,558,155 A | * | 9/1996 | Ito | B23K 1/0012 174/16.3 |
| 6,213,196 B1 | * | 4/2001 | Ozaki | F28D 1/0435 165/135 |
| 6,336,326 B1 | * | 1/2002 | Conrad | F28D 7/103 60/524 |
| 8,464,799 B2 | * | 6/2013 | Scott | E21B 34/16 166/373 |
| 2003/0016495 A1 | | 1/2003 | Hongo | |
| 2003/0079860 A1 | | 5/2003 | Hoffmann et al. | |
| 2003/0155110 A1 | * | 8/2003 | Joshi | F28F 3/027 174/16.3 |

(Continued)

FOREIGN PATENT DOCUMENTS

JP    H04269855 A    9/1992
WO   2018087480 A1   5/2018

OTHER PUBLICATIONS

European Patent Office, Extended Search Report issued in corresponding Application No. 19213829.5, dated Jun. 18, 2020, 7 pp.

*Primary Examiner* — Adam B Dravininkas

(74) *Attorney, Agent, or Firm* — Leydig, Voit & Mayer, Ltd.

(57) ABSTRACT

A heat exchanger comprising a body part and a cooling fin system having an inlet end and an outlet end. The cooling fin system has a plurality of cooling fins, and is adapted to provide a flow path for a coolant flow through the cooling fin system in a longitudinal direction. The coolant flow is adapted to enter the cooling fin system through an inlet surface of the cooling fin system. The inlet surface of the cooling fin system is a non-planar surface.

20 Claims, 3 Drawing Sheets

(56) References Cited

U.S. PATENT DOCUMENTS

| | | | |
|---|---|---|---|
| 2004/0244947 A1* | 12/2004 | Chen | F28F 13/06 |
| | | | 257/E23.099 |
| 2005/0061482 A1* | 3/2005 | Lee | F28F 3/02 |
| | | | 257/E23.098 |
| 2007/0035926 A1* | 2/2007 | Xia | H01L 23/467 |
| | | | 257/E23.099 |
| 2008/0302512 A1* | 12/2008 | Liao | H01L 23/467 |
| | | | 165/104.11 |
| 2010/0124020 A1* | 5/2010 | Lin | H01L 23/3672 |
| | | | 361/697 |

* cited by examiner

HEAT EXCHANGER AND COOLED ELECTRICAL ASSEMBLY COMPRISING THE SAME

FIELD OF THE INVENTION

The present invention relates to a heat exchanger and a cooled electrical assembly comprising the heat exchanger.

It is known in the art to provide a heat exchanger with a cooling fin system comprising a plurality of cooling fins.

One of the disadvantages associated with the above heat exchanger is that the cooling fin system causes noise when a coolant flow generated by a coolant transfer system flows through the cooling fin system.

BRIEF DESCRIPTION OF THE INVENTION

An object of the present invention is to provide a heat exchanger so as to alleviate the above disadvantage. The objects of the invention are achieved by a heat exchanger and a cooled electrical assembly comprising the heat exchanger which are characterized by what is stated in the independent claims. The preferred embodiments of the invention are disclosed in the dependent claims.

The invention is based on the idea of providing an inlet surface of the cooling fin system with a non-planar shape, wherein the inlet surface of the cooling fin system is an imaginary surface through which the coolant flow is adapted to enter the cooling fin system. In an embodiment, the non-planar shape of the inlet surface of the cooling fin system is provided by non-linear shape of inlet edges of a plurality of cooling fins of the cooling fin system. In other embodiments, the non-planar shape of the inlet surface of the cooling fin system alternatively or additionally is provided by arrangement of the plurality of cooling fins.

An advantage of the heat exchanger according to present invention is a reduction in noise caused by the coolant flow flowing through the cooling fin system. Another advantage is a reduction in a pressure loss caused in the coolant flow by the cooling fin system. Yet another advantage is an improvement in a cooling capacity of the heat exchanger due to increased turbulence in the coolant flow flowing through a flow path provided by the cooling fin system.

BRIEF DESCRIPTION OF THE DRAWINGS

In the following the invention will be described in greater detail by means of preferred embodiments with reference to the attached drawings, in which.

DETAILED DESCRIPTION OF THE INVENTION

Figure 1:
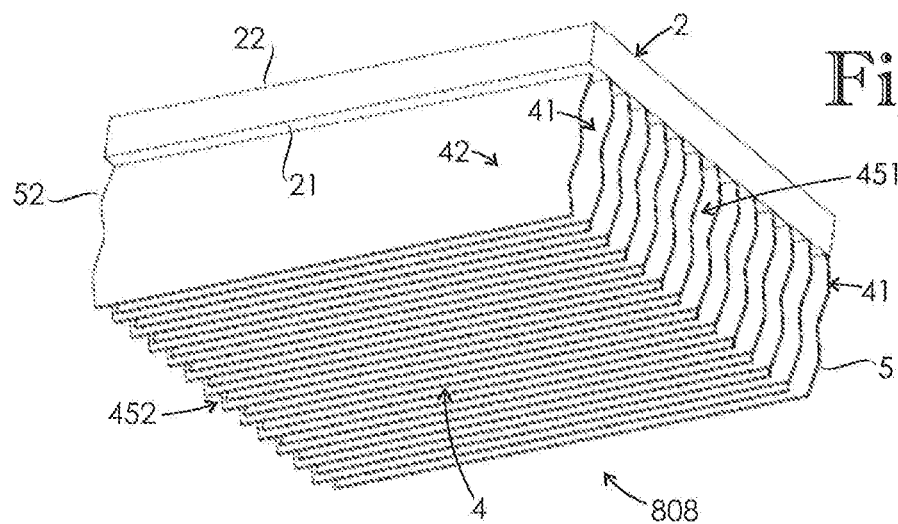
FIG. 1 is an axonometric projection of a heat exchanger according to an embodiment of present invention.

FIG. 1 shows a heat exchanger 808 comprising a body part 2 and a cooling fin system 4. FIG. 1 is an axonometric projection of the heat exchanger 808.

The body part 2 is made of heat conductive material, and comprises a first surface 21, which is a substantially planar surface. The cooling fin system 4 has an inlet end 451 and an outlet end 452 spaced apart from each other in a longitudinal direction. The inlet end 451 of the cooling fin system 4 is adapted to receive a coolant flow in a coolant flow direction parallel to the longitudinal direction.

The cooling fin system 4 is adapted to provide a flow path for the coolant flow through the cooling fin system 4 in the longitudinal direction. The cooling fin system 4 has a plurality of cooling fins 41 and 42 spaced apart from each other in a width direction perpendicular to the longitudinal direction. Gaps between the cooling fins forming the flow path are best seen in FIG. 2 which shows the heat exchanger 808 from a direction perpendicular to both the longitudinal direction and the width direction.

Figure 2:
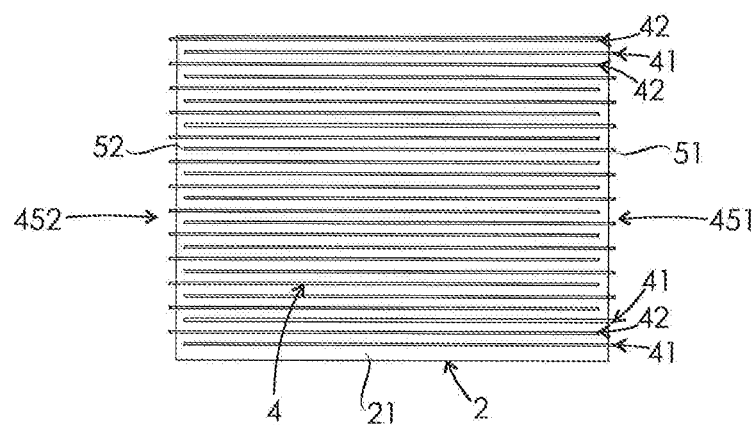
FIG. 2 shows the heat exchanger of FIG. 1 from below.

FIG. 2 shows that a gap between adjacent cooling fins is greater than thickness of the cooling fins in the width direction. In alternative embodiments, a gap between adjacent cooling fins is greater than 50% of thickness of the cooling fins, and less than twenty times the thickness of the cooling fins.

In FIG. 2 the coolant flow direction is a horizontal, leftwards direction, the width direction is a vertical direction, and a normal of a plane defined by the first surface 21 of the body part 2 is perpendicular to the image plane. FIG. 2 shows that the flow path provided by the cooling fin system 4 is a substantially straight flow path.

Each of the cooling fins 41 and 42 is made of a heat conductive sheet material, and is thermally conductively connected to the first surface 21 of the body part 2. Each cooling fin 41 and 42 has a first fin surface and a second fin surface located at opposite sides of the cooling fin. The first fin surfaces and the second fin surfaces are substantially perpendicular to the width direction. The first fin surfaces and the second fin surfaces are adapted to be in heat transfer connection with the coolant flow flowing in the flow path.

Each cooling fin 41 and 42 has at the inlet end 451 of the cooling fin system 4 an inlet edge 51 adapted to first encounter the coolant flow entering the cooling fin system 4 in the coolant flow direction, and at the outlet end 452 of the cooling fin system 4 an outlet edge 52 adapted to be the last portion of the cooling fin to be in contact with the coolant flow leaving the cooling fin system 4 in the coolant flow direction. The inlet edge 51 is a transverse surface connecting the first fin surface and the second fin surface. In other words, the inlet edge 51 is a surface generally adapted to face an incoming coolant flow, and the outlet edge 52 is a surface generally adapted to face the direction into which the coolant flow leaves the cooling fin system 4.

Each inlet edge 51 has a centre curve defined by centre curve points. Each centre curve point is located at equal distance from the first fin surface and the second fin surface.

The coolant flow is adapted to enter the cooling fin system 4 through an inlet surface of the cooling fin system 4. The inlet surface of the cooling fin system 4 is an imaginary surface located at the inlet end 451 of the cooling fin system 4. The inlet surface of the cooling fin system 4 is a non-planar surface.

The inlet surface of the cooling fin system 4 is defined by the inlet edges 51 of the plurality of cooling fins, together with auxiliary lateral curves each extending on a corresponding basic plane defined by the longitudinal direction and the width direction, and connecting the inlet edges 51 of adjacent cooling fins by a straight line segment. Each said straight line segment connecting inlet edges 51 of adjacent cooling fins has a starting point at a junction of an inlet edge 51 and a first fin surface of a cooling fin, and a final point at a junction of an inlet edge 51 and a second fin surface of another cooling fin. The auxiliary lateral curves are imaginary curves, or mathematical curves.

It should be noted that the entire inlet surface of the cooling fin system 4 is not available for the coolant flow since the coolant flow can only flow in the flow path formed by the gaps between the plurality of cooling fins 41 and 42. However, shape of the inlet edges 51 of the plurality of cooling fins does affect the coolant flow.

The centre curve of the inlet edge 51 of each of the plurality of cooling fins 41 and 42 has a centre curve projection on a first plane parallel to the longitudinal direction, and perpendicular to the width direction. The plurality of cooling fins comprises a first set of cooling fins having thirteen first cooling fins 41, and a second set of cooling fins having thirteen second cooling fins 42. The centre curve projections of the first cooling fins 41 coincide with each other, the centre curve projections of the second cooling fins 42 coincide with each other, and the centre curve projections of the first cooling fins 41 differ from the centre curve projections of the second cooling fins 42 such that there are no common points forming a curve. In alternative embodiments less than 50% of a length of the centre curve projection of the first cooling fin coincides with the centre curve projection of the second cooling fin.

Figure 3:
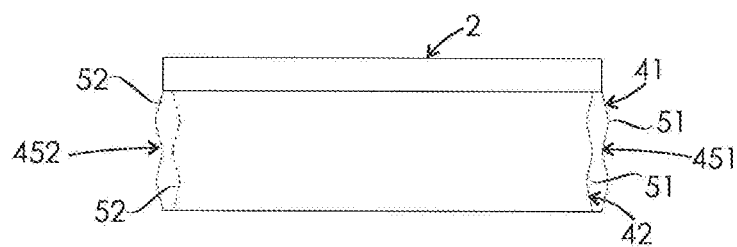
FIG. 3 is a side view of the heat exchanger of FIG. 1.

FIG. 3 is a side view of the heat exchanger 808. In FIG. 3, the coolant flow direction is a horizontal, leftwards direction, and the width direction is perpendicular to the image plane. FIG. 3 shows that the centre curve projection of the first cooling fin 41 does not even intersect with the centre curve projection of the second cooling fin 42. In FIG. 3, the outlet edge 52 of the first cooling fin 41 is represented by a dash line since it is behind the second cooling fin 42 located foremost in line.

FIG. 3 shows that the centre curve projections of the first cooling fins 41 define a first wave, and the centre curve projections of the second cooling fins 42 define a second wave. The first wave and the second wave have the same amplitude and the same wavelength, and a phase shift between the first wave and the second wave is pi radians. In an alternative embodiment, the first wave and the second wave have the same amplitude and the same wavelength, and a phase shift between the first wave and the second wave is in a range of $\pi/2$-$\pi$ it radians. In FIG. 3, the amplitudes of the first wave and the second wave are measured in the horizontal direction, and the wavelengths of the first wave and the second wave are measured in the vertical direction.

In the embodiment of FIG. 3, the first wave and the second wave are sine waves. In an alternative embodiment, the first wave and the second wave are smooth periodic oscillations. In another alternative embodiment, the first wave and the second wave are smooth periodic oscillations. In yet another alternative embodiment, the first wave and the second wave are smooth aperiodic oscillations. In yet another alternative embodiment, the first wave and the second wave comprise square waves, triangle waves and/or sawtooth waves.

Amplitude of the wave defined by the centre curve projection of each cooling fin is much smaller than a longitudinal dimension of the cooling fin. In the embodiment of FIG. 1, the amplitudes of the waves defined by the centre curve projections are less than 10% of a longitudinal dimension of the cooling fins 41 and 42. In an embodiment, an amplitude of the wave defined by the centre curve projection is greater than or equal to 5 mm.

The coolant flow is adapted to leave the cooling fin system 4 through an outlet surface of the cooling fin system 4. The outlet surface of the cooling fin system 4 is an imaginary surface located at the outlet end 452 of the cooling fin system 4. The outlet surface of the cooling fin system 4 is defined by the outlet edges 52 of the plurality of cooling fins, together with auxiliary lateral curves each extending on a corresponding basic plane defined by the longitudinal direction and the width direction, and connecting the outlet edges 52 of adjacent cooling fins by a straight line segment. The outlet surface of the cooling fin system 4 is a non-planar surface.

The first cooling fins 41 are identical with the second cooling fins 42 such that the heat exchanger 808 has twenty-six identical cooling fins. Each of the cooling fins 41 and 42 has a first longitudinal end and a second longitudinal end. The plurality of cooling fins 41 and 42 are arranged alternately such that a first position and a second position alternate. The first position is a position in which the first longitudinal end is at the inlet end 451 of the cooling fin system 4, and the second longitudinal end is at the outlet end 452 of the cooling fin system 4. The second position is a position in which the first longitudinal end is at the outlet end 452 of the cooling fin system 4, and the second longitudinal end is at the inlet end 451 of the cooling fin system 4. The first position and the second position are spaced apart in the longitudinal direction. Each first cooling fin 41 is in the first position, and each second cooling fin is in the second position.

In the heat exchanger 808, each of the plurality of cooling fins 41 and 42 is a planar component, and the coolant flow is adapted to flow parallel to planes defined by the cooling fins. The centre curve of the inlet edge 51 of each cooling fin extends on a plane parallel to the first plane.

In an alternative embodiment the centre curve of the inlet edge of each cooling fin defines a three-dimensional curve such that the cooling fin comprises, at the inlet end of the cooling fin system, a coolant guide portion adapted to induce turbulence in a coolant flow flowing through the cooling fin system. At the inlet end of the cooling fin system, each cooling fin is bent in the width direction in order to provide the three-dimensional shape for the centre curve of the inlet edge. In said alternative embodiment, the coolant guide portion has a shape of a known airfoil-shaped blade used in a fan or a propeller, for example. Further, in said alternative embodiment, a dimension of the coolant guide portion in the longitudinal direction is less than amplitudes of waves defined by the centre curve projections of the cooling fins.

Figure 4:
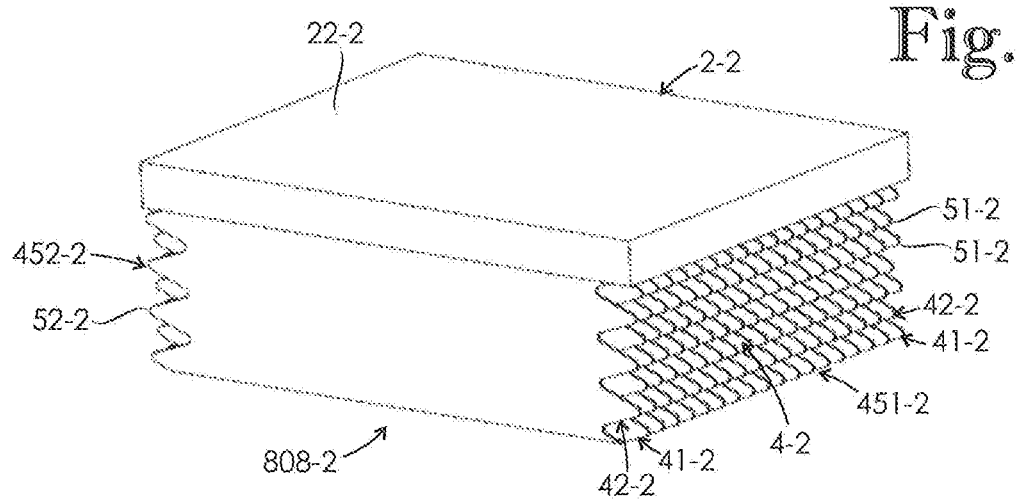
FIG. 4 is an axonometric projection of a heat exchanger according to another embodiment of present invention.
Figure 5:
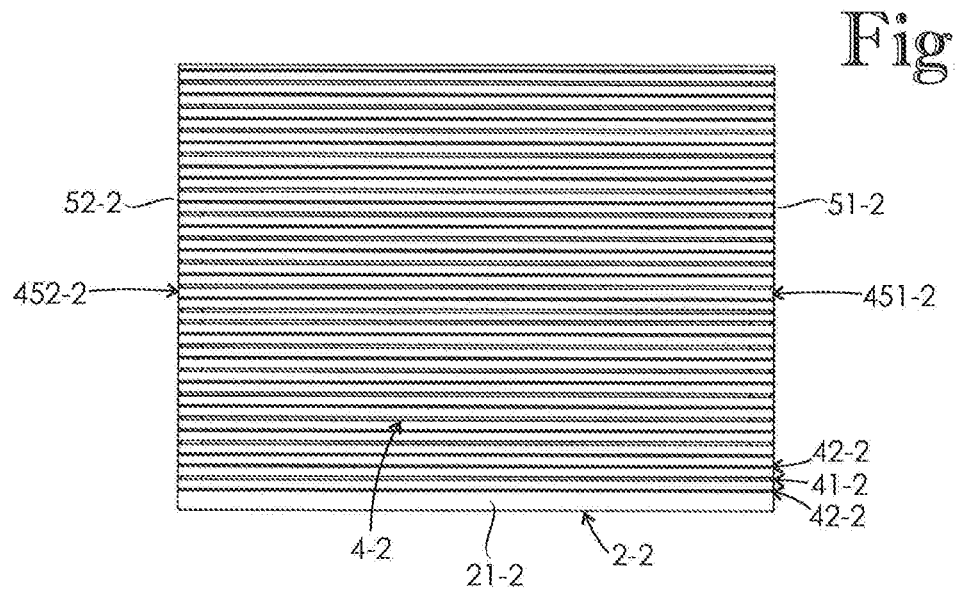
FIG. 5 shows the heat exchanger of FIG. 4 from below.
Figure 6:
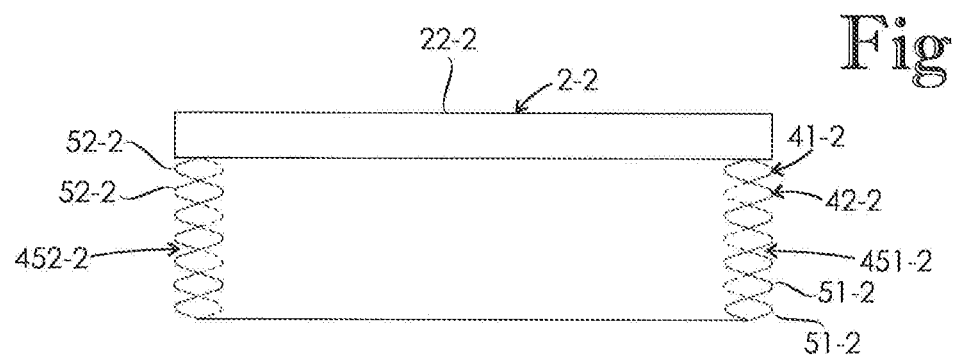
FIG. 6 is a side view of the heat exchanger of FIG. 4.

FIGS. 4 to 6 depict a heat exchanger 808-2 according to another embodiment of present invention. FIG. 4 is an axonometric projection of the heat exchanger 808-2, FIG. 5 shows the heat exchanger 808-2 from below, and FIG. 6 is a side view of the heat exchanger 808-2.

The heat exchanger 808-2 comprises a body part 2-2 and a cooling fin system 4-2. The cooling fin system 4-2 has a plurality of cooling fins 41-2 and 42-2 spaced apart from each other in the width direction perpendicular to the longitudinal direction. The centre curve projections of the first cooling fins 41-2 define a first wave, and the centre curve projections of the second cooling fins 42-2 define a second wave. Amplitudes of the first waves and the second waves are greater than in the embodiment shown in FIG. 1.

Wavelengths of the first waves and the second waves are shorter than in the embodiment shown in FIG. 1.

In FIG. 6, both the inlet edges 51-2 and the outlet edges 52 of the first two cooling fins 41-2 and 42-2 are shown in order to illustrate the phase shift of pi radians between the first wave and the second wave. Those parts of the inlet edges 51-2 and the outlet edges 52 that are not actually in view from the lateral direction, are represented by dash lines.

Figure 7A:
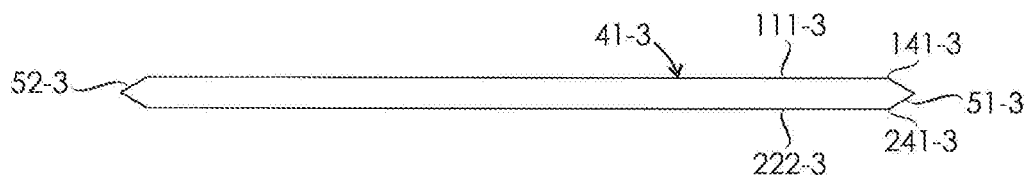
FIG. 7a shows a cross-section of a cooling fin having a V-shaped inlet edge.
Figure 7B:
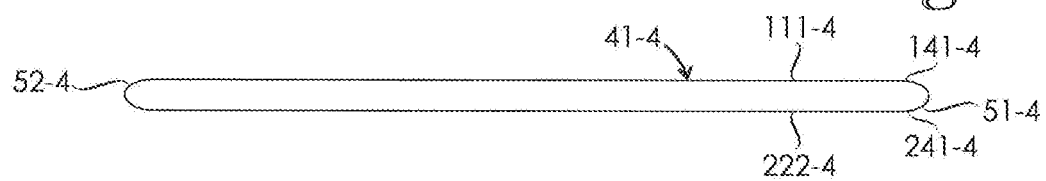
FIG. 7b shows a cross-section of a cooling fin having a convex inlet edge.

It is possible to reduce a pressure loss caused in the coolant flow due to the cooling fins by providing an inlet edge of each of the cooling fins with a non-rectangular cross-section on a second plane perpendicular to the first plane, and parallel to the longitudinal direction. Examples of said non-rectangular cross-section are shown in FIGS. 7a and 7b. FIG. 7a shows a cooling fin 41-3 whose inlet edge 51-3 has a V-shaped cross-section on the second plane. FIG. 7b shows a cooling fin 41-4 whose inlet edge 51-4 has a convex cross-section on the second plane.

In FIG. 7a, a junction of the inlet edge 51-3 and a first fin surface 111-3 of the cooling fin 41-3 is denoted with 141-3, and a junction of the inlet edge 51-3 and a second fin surface 222-3 of the cooling fin 41-3 is denoted with 241-3. In FIG. 7b, a junction of the inlet edge 51-4 and a first fin surface 111-4 of the cooling fin 41-4 is denoted with 141-4, and a junction of the inlet edge 51-4 and a second fin surface 222-4 of the cooling fin 41-4 is denoted with 241-4. FIGS. 7a and 7b show that longitudinal dimensions of the inlet edges 51-3 and 51-4 are small compared with longitudinal dimensions of corresponding cooling fins 41-3 and 41-4.

Figure 8:
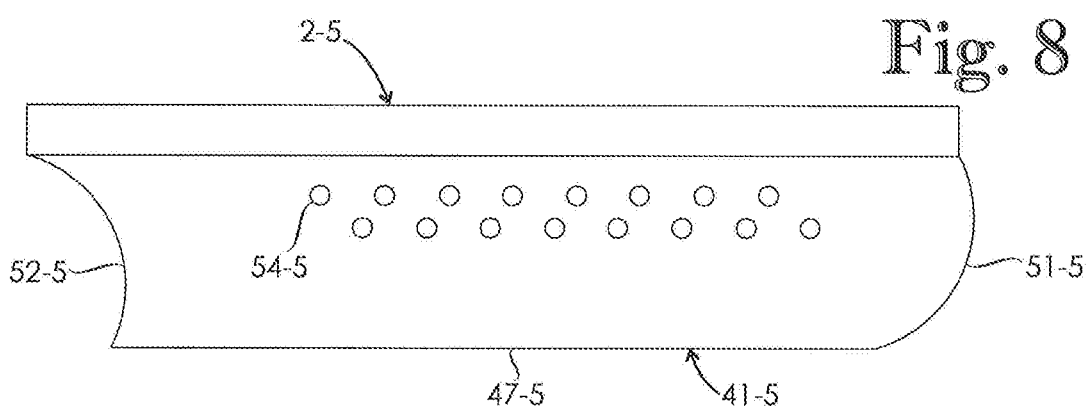
FIG. 8 shows a cooling fin provided with a plurality of turbulence holes extending through the cooling fin in a width direction.

FIG. 8 shows a cooling fin 41-5 of a heat exchanger according to an alternative embodiment. The cooling fin 41-5 is provided with a plurality of turbulence holes 54-5 extending through the cooling fin 41-5 in the width direction. The plurality of turbulence holes is adapted to induce turbulence in a coolant flow flowing through the cooling fin system, thereby improving cooling capacity of the heat exchanger.

Each of the turbulence holes 54-5 is located in an inner section of the cooling fin 41-5 adjacent the body part 2-5. In other words, distance between each turbulence hole 54-5 and the body part 2-5 is less than distance between the turbulence hole 54-5 and a free longitudinal edge 47-5 of the cooling fin 41-5, the free longitudinal edge 47-5 extending in the longitudinal direction, and being spaced apart from the body part 2-5.

The inlet edge 51-5 of the cooling fin 41-5 is a convex edge. The outlet edge 52-5 of the cooling fin 41-5 is a concave edge.

Figure 9:
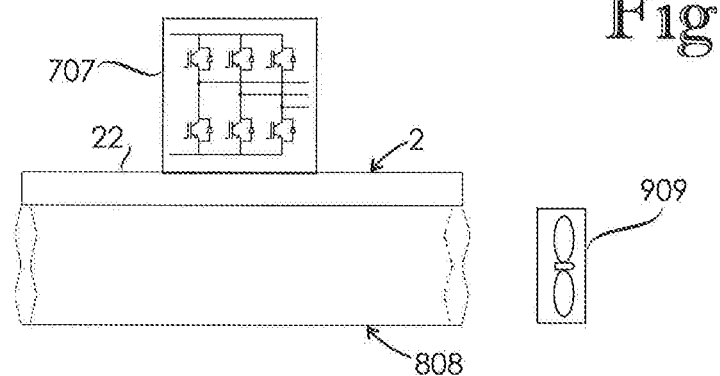
FIG. 9 is a schematic side view of a cooled electrical assembly according to an embodiment of present invention.

FIG. 9 is a schematic side view of a cooled electrical assembly according to an embodiment of present invention. The cooled electrical assembly comprises a heat generating electrical system 707 requiring cooling, the heat exchanger 808 in heat transfer connection with the heat generating electrical system 707, and a coolant transfer system 909 adapted to provide a coolant flow through the heat exchanger 808.

The heat generating electrical system 707 is in heat transfer connection with a second surface 22 of the body part 2, the second surface 22 facing an opposite direction than the first surface 21 of the body part 2. The heat generating electrical system 707 comprises a plurality of controllable semiconductor switches.

In the embodiment of FIG. 9, the coolant flow is an air flow, and the coolant transfer system 909 comprises a fan.

It will be obvious to a person skilled in the art that the inventive concept can be implemented in various ways. The invention and its embodiments are not limited to the examples described above but may vary within the scope of the claims.

The invention claimed is:

1. A heat exchanger comprising:
    a body part made of heat conductive material, the body part comprising a first surface; and
    a cooling fin system having an inlet end and an outlet end spaced apart from each other in a longitudinal direction, the inlet end of the cooling fin system is adapted to receive a coolant flow in a coolant flow direction parallel to the longitudinal direction, and the cooling fin system is adapted to provide a flow path for the coolant flow through the cooling fin system in the longitudinal direction, the cooling fin system has a plurality of cooling fins spaced apart from each other in a width direction perpendicular to the longitudinal direction, each of the cooling fins is made of a heat conductive material, is thermally conductively connected to the first surface of the body part, has a first fin surface and a second fin surface located at opposite sides of the cooling fin, and has at the inlet end of the cooling fin system an inlet edge adapted to first encounter the coolant flow entering the cooling fin system in the coolant flow direction, wherein the coolant flow is adapted to enter the cooling fin system through an inlet surface of the cooling fin system, the inlet surface being defined by the inlet edges of the plurality of cooling fins, together with auxiliary lateral curves each extending on a corresponding basic plane defined by the longitudinal direction and the width direction, and connecting the inlet edges of adjacent cooling fins by a straight line segment,
    wherein the inlet surface of the cooling fin system is a non-planar surface, wherein each inlet edge has a centre curve defined by centre curve points each located at equal distance from the first fin surface and the second fin surface, the centre curve of the inlet edge of each of the plurality of cooling fins has a centre curve projection on a first plane parallel to the longitudinal direction, and perpendicular to the width direction, and the plurality of cooling fins comprises a first set of cooling fins having at least one first cooling fin, and a second set of cooling fins having at least one second cooling fin, wherein the centre curve projections of the first cooling fins coincide with each other, the centre curve projections of the second cooling fins coincide with each other, and the centre curve projections of the first cooling fins differ from the centre curve projections of the second cooling fins, and
    the centre curve projections of the first cooling fins define a first wave, and the centre curve projections of the second cooling fins define a second wave.

2. The heat exchanger according to claim 1, wherein the first wave and the second wave have the same amplitude and the same wavelength, and a phase shift between the first wave and the second wave is in a range of π/2-π radians.

3. The heat exchanger according to claim 2, wherein the centre curve of the inlet edge of each cooling fin defines a three-dimensional curve such that the cooling fin comprises a coolant guide portion adapted to induce turbulence in the coolant flow flowing through the cooling fin system.

4. The heat exchanger according to claim 3, wherein the flow path provided by the cooling fin system is a straight flow path.

5. The heat exchanger according to claim 4, wherein the first surface of the body part is a planar surface.

6. The heat exchanger according to claim 5, wherein a cross-section of the inlet edge of each of the cooling fins on a second plane perpendicular to the first plane, and parallel to the longitudinal direction, is a non-rectangular cross-section adapted to reduce pressure loss caused in the coolant flow due to the inlet edge.

7. The heat exchanger according to claim 2, wherein a cross-section of the inlet edge of each of the cooling fins on a second plane perpendicular to the first plane, and parallel to the longitudinal direction, is a non-rectangular cross-section adapted to reduce pressure loss caused in the coolant flow due to the inlet edge.

8. The heat exchanger according to claim 7, wherein said cross-section of the inlet edge of each of the cooling fins is a convex or V-shaped cross-section.

9. The heat exchanger according to claim 1, wherein the centre curve of the inlet edge of each cooling fin defines a three-dimensional curve such that the cooling fin comprises a coolant guide portion adapted to induce turbulence in the coolant flow flowing through the cooling fin system.

10. The heat exchanger according to claim 1, wherein the flow path provided by the cooling fin system is a straight flow path.

11. The heat exchanger according to claim 1, wherein the first surface of the body part is a planar surface.

12. The heat exchanger according to claim 1, wherein a cross-section of the inlet edge of each of the cooling fins on a second plane perpendicular to the first plane, and parallel to the longitudinal direction, is a non-rectangular cross-section adapted to reduce pressure loss caused in the coolant flow due to the inlet edge.

13. The heat exchanger according to claim 12, wherein said cross-section of the inlet edge of each of the cooling fins is a convex or V-shaped cross-section.

14. The heat exchanger according to claim 1, wherein each of the plurality of cooling fins is provided with a plurality of turbulence holes extending through the cooling fin in the width direction, the plurality of turbulence holes being adapted to induce turbulence in the coolant flow flowing through the cooling find system.

15. The heat exchanger according to claim 1, wherein each of the cooling fins has at the outlet end of the cooling fin system an outlet edge, wherein the coolant flow is adapted to leave the cooling fin system through an outlet surface of the cooling fin system, the outlet surface of the cooling fin system being defined by the outlet edges of the plurality of cooling gins, together with auxiliary lateral curves each extending on a corresponding basic plane defined by the longitudinal direction and the width direction, and connecting the outlet edges of adjacent cooling fins by a straight line segment, and the outlet surface of the cooling fin system is a non-planar surface.

16. The heat exchanger according to claim 1, wherein the plurality of cooling fins are identical components each having a first longitudinal end and a second longitudinal end, wherein the plurality of cooling fins are arranged alternately such that a first position and a second position alternate, the first position being a position in which the first longitudinal end is at the inlet end of the cooling fin system, and the second longitudinal end is at the outlet end of the cooling fin system, and the second position being a position in which the first longitudinal end is at the outlet end of the cooling fin system, and the second longitudinal end is at the inlet end of the cooling fin system.

17. A cooled electrical assembly comprising:
a heat generating electrical system requiring cooling;
a heat exchanger in heat transfer connection with the heat generating electrical system; and
a coolant transfer system adapted to provide a coolant flow through the heat exchanger,
wherein the heat exchanger is a heat exchanger according to claim 1.

18. The cooled electrical assembly according to claim 17, wherein the first wave and the second wave have the same amplitude and the same wavelength, and a phase shift between the first wave and the second wave is in a range of $\pi/2$-$\pi$ radians.

19. The cooled electrical assembly according to claim 17, wherein the centre curve of the inlet edge of each cooling fin defines a three-dimensional curve such that the cooling fin comprises a coolant guide portion adapted to induce turbulence in the coolant flow flowing through the cooling fin system.

20. The cooled electrical assembly according to claim 17, wherein a cross-section of the inlet edge of each of the cooling fins on a second plane perpendicular to the first plane, and parallel to the longitudinal direction, is a non-rectangular cross-section adapted to reduce pressure loss caused in the coolant flow due to the inlet edge; and
wherein said cross-section of the inlet edge of each of the cooling fins is a convex or V-shaped cross-section.

\* \* \* \* \*